(12) United States Patent
Krasienapibal et al.

(10) Patent No.: US 10,483,083 B2
(45) Date of Patent: Nov. 19, 2019

(54) SCANNING ELECTRON MICROSCOPE AND IMAGE PROCESSING APPARATUS

(71) Applicant: HITACHI, LTD., Chiyoda-ku, Tokyo (JP)

(72) Inventors: Thantip Krasienapibal, Tokyo (JP); Yasuhiro Shirasaki, Tokyo (JP); Momoyo Enyama, Tokyo (JP); Sayaka Kurata, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/043,958

(22) Filed: Jul. 24, 2018

(65) Prior Publication Data
US 2019/0035597 A1    Jan. 31, 2019

(30) Foreign Application Priority Data
Jul. 31, 2017 (JP) .................. 2017-147907

(51) Int. Cl.
| | |
|---|---|
| H01J 37/28 | (2006.01) |
| H01J 37/20 | (2006.01) |
| H01J 37/22 | (2006.01) |
| G06K 9/32 | (2006.01) |
| G06K 9/46 | (2006.01) |

(Continued)

(52) U.S. Cl.
CPC .......... *H01J 37/222* (2013.01); *G06K 9/0014* (2013.01); *G06K 9/3233* (2013.01); *G06K 9/4661* (2013.01); *H01J 37/20* (2013.01); *H01J 37/244* (2013.01); *H01J 37/28* (2013.01); *H01J 2237/20207* (2013.01); *H01J 2237/20214* (2013.01); *H01J 2237/20235* (2013.01); *H01J 2237/282* (2013.01);

(Continued)

(58) Field of Classification Search
CPC ........ H01J 37/20; H01J 37/222; H01J 37/244; H01J 37/28; H01J 2237/20207; H01J 2237/20214; H01J 2237/20235; H01J 2237/2806; H01J 2237/2813; G06K 9/0014; G06K 9/3233; G06K 9/4661
See application file for complete search history.

(56) References Cited

U.S. PATENT DOCUMENTS

| | | | |
|---|---|---|---|
| 2003/0130803 A1 | 7/2003 | Chou et al. | |
| 2017/0133195 A1* | 5/2017 | Yaguchi | .......... H01J 37/22 |

FOREIGN PATENT DOCUMENTS

| | | |
|---|---|---|
| JP | 7-66253 A | 3/1995 |
| JP | 2003-121394 A | 4/2003 |

* cited by examiner

*Primary Examiner* — Eliza W Osenbaugh-Stewart
(74) *Attorney, Agent, or Firm* — Miles & Stockbridge, PC

(57) ABSTRACT

In this invention, information of material composition, process conditions and candidates of crystal structure either known or imported from material database is used to determine sample stage tilt angle and working distance (WD). Under these determined tilt angle and WD, the intensity of the electrons emitted at different angles and with different energies is measured using a scanning electron microscope (SEM) system comprising: a use of materials database containing materials composition, formation process, crystal structure and its electron yield; a sample stage that is able to move, rotate and tilt; an processing section for calculating optimum working distance for an observation from material database and measurement condition; means for acquiring an image of crystal information of a desired area of a sample based on an image obtained from SEM observation.

15 Claims, 19 Drawing Sheets

(51) Int. Cl.
*H01J 37/244* (2006.01)
*G06K 9/00* (2006.01)
(52) U.S. Cl.
CPC ............... *H01J 2237/2804* (2013.01); *H01J 2237/2806* (2013.01); *H01J 2237/2813* (2013.01)

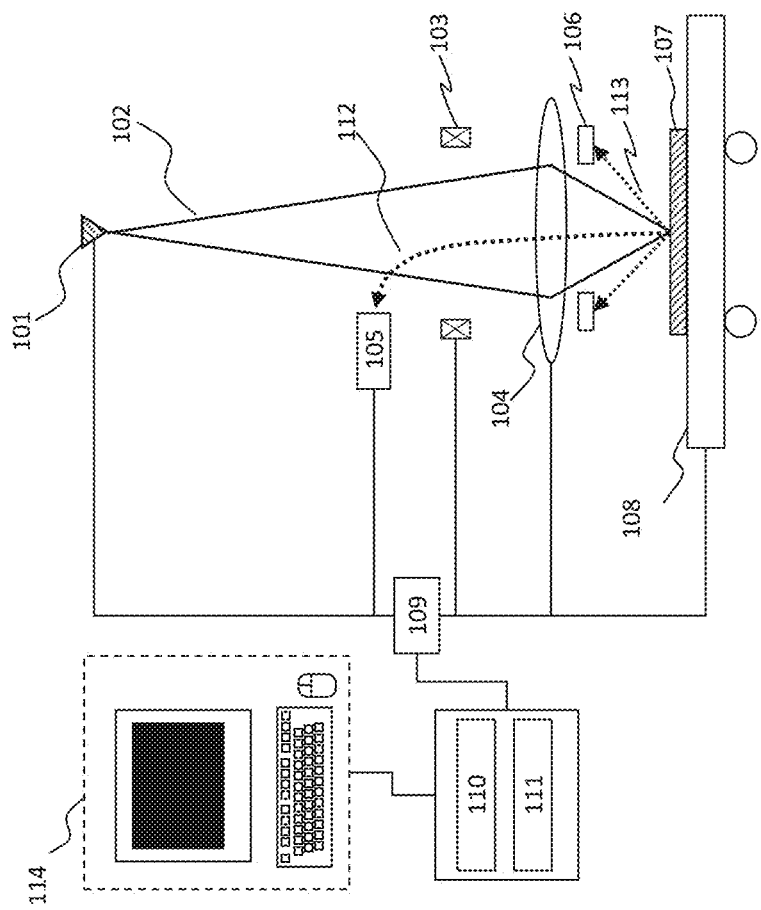

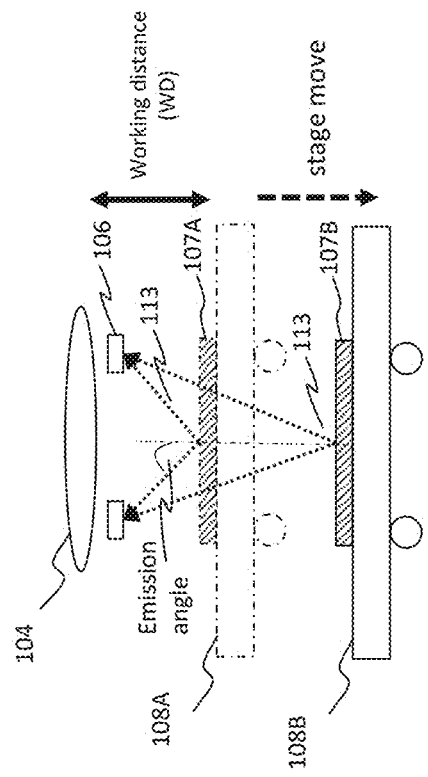

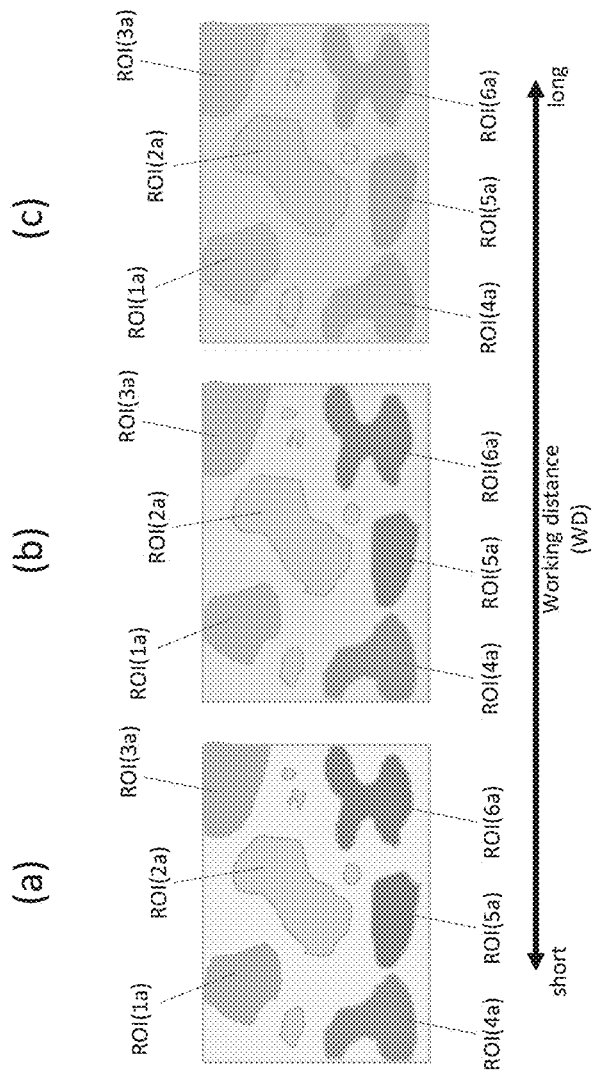

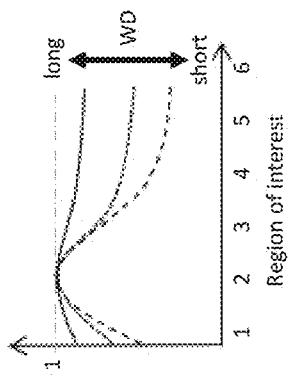

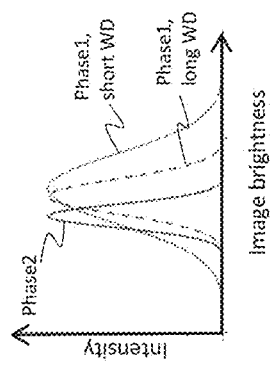
[FIG. 2D]

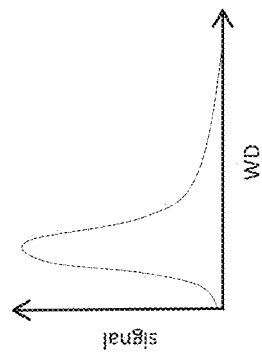

[FIG. 4]
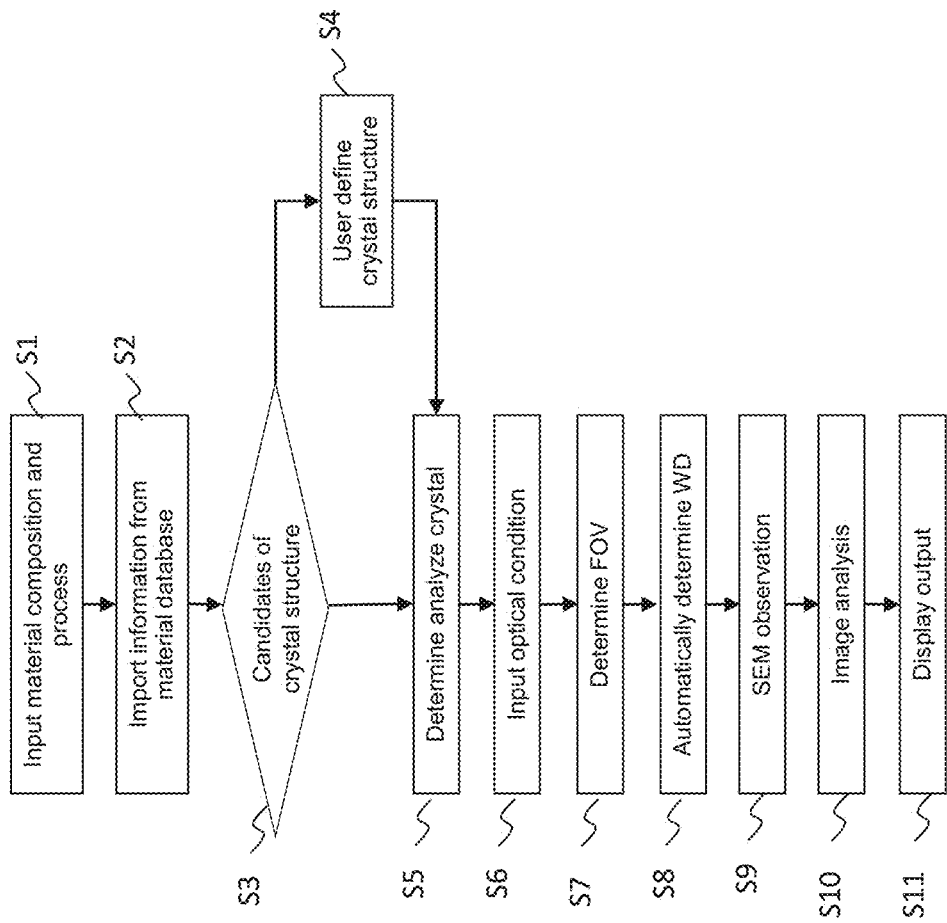

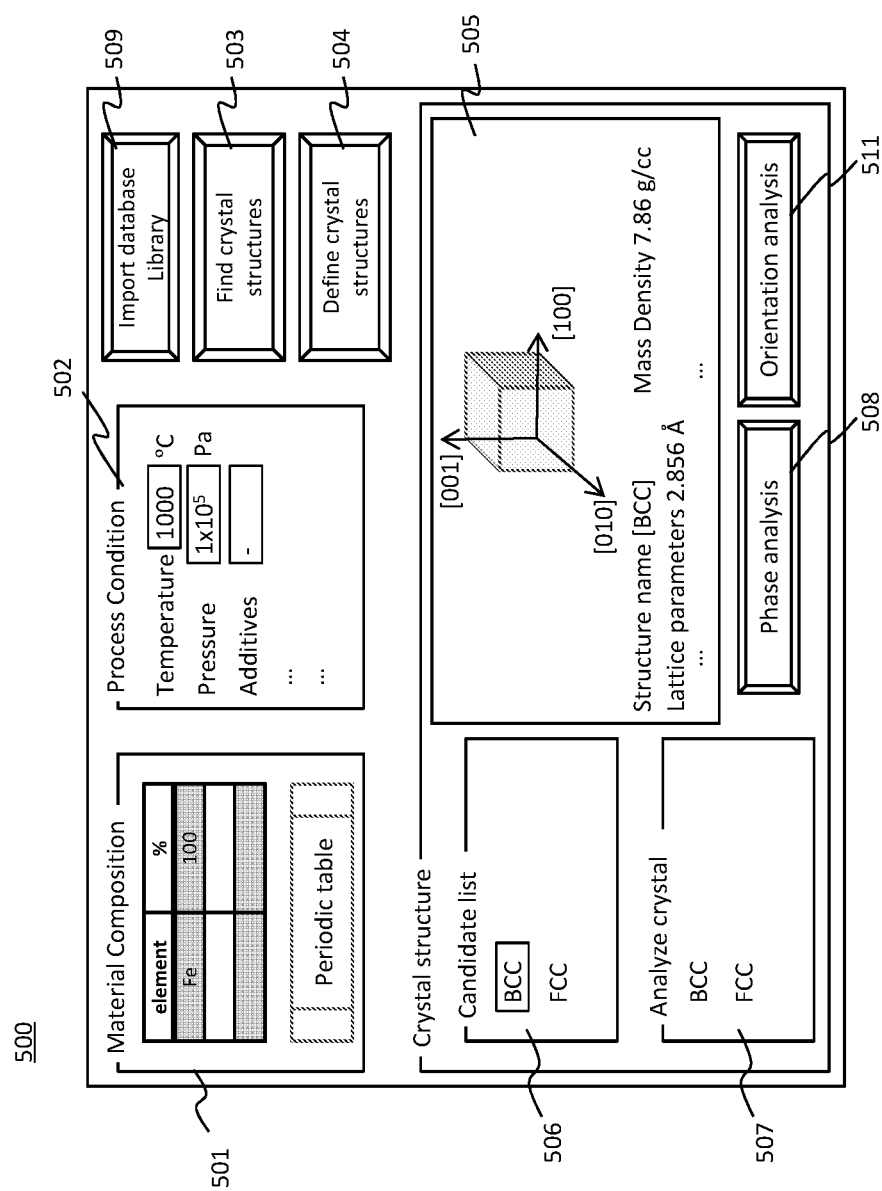

[FIG. 6]

| element | % | T | P | $R_{quenc}$ | Additive | Phase | Orient. | SEY, 5kV | SEY, 10 kV | BSEY, 5kV | BSEY, 10 kV | ... |
|---|---|---|---|---|---|---|---|---|---|---|---|---|
| Fe | 100 | 850 | $10^5$ | 10 | - | BCC | Multi | 0.36 | 0.25 | 0.28 | 0.29 | |
| Fe | 100 | 950 | $2\times10^5$ | 30 | Al | BCC | Multi | 0.36 | 0.25 | 0.28 | 0.29 | |
| ... | | | | | | FCC | Single | 0.4 | 0.26 | 0.29 | 0.30 | |

T: temperature (°C)  $R_{quenc}$: quenching rate (°C/s)  SEY: secondary electron yield
P: Pressure (Pa)  Additive: dopant  BSEY: back-scattered electron yield
Phase: crystal phase
Additive: dopant

601

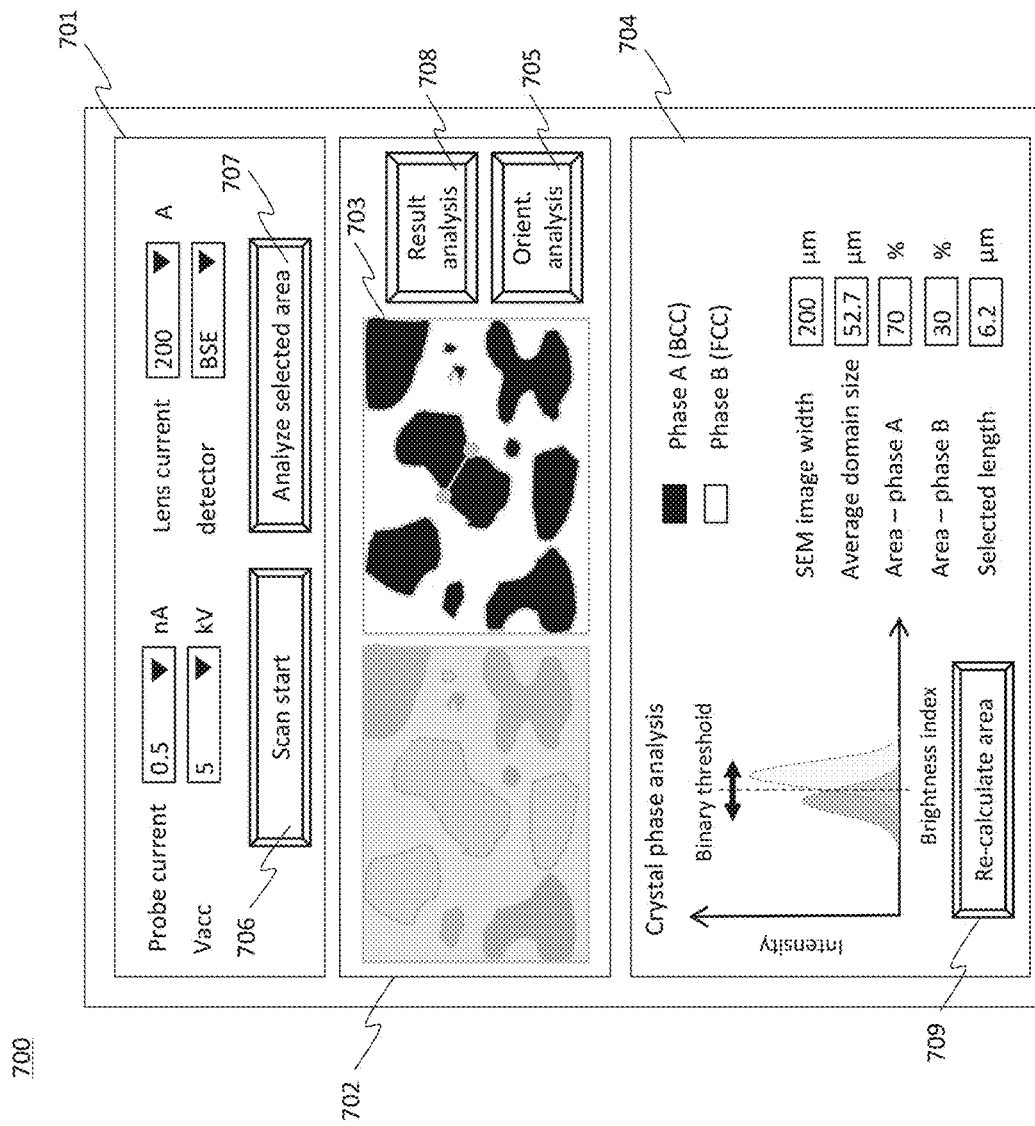
[FIG. 7]

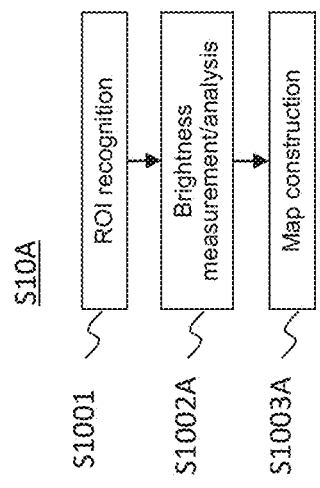
[FIG. 8A]
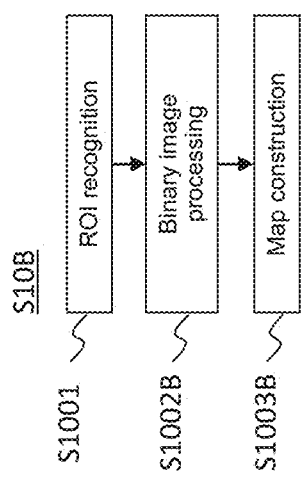
[FIG. 8B]

[FIG. 9A]
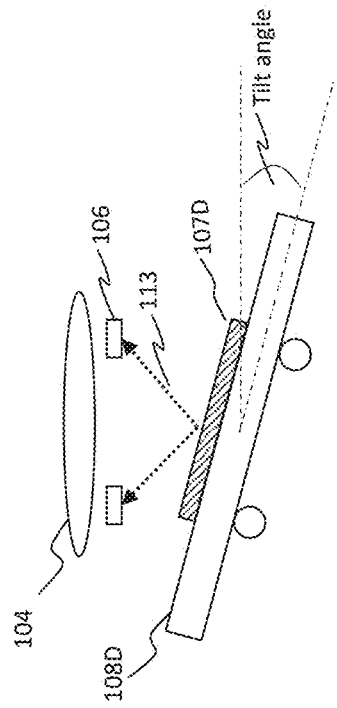

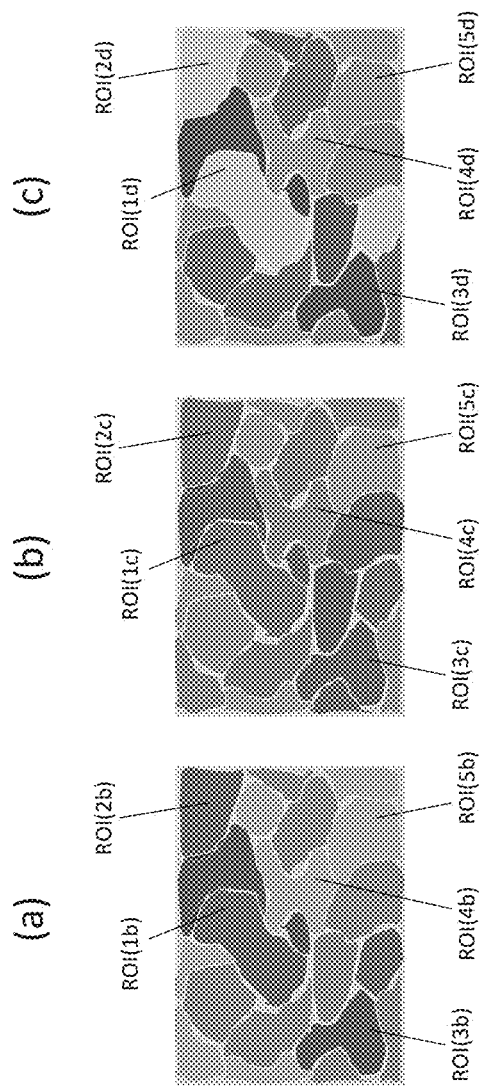
[FIG. 9B]

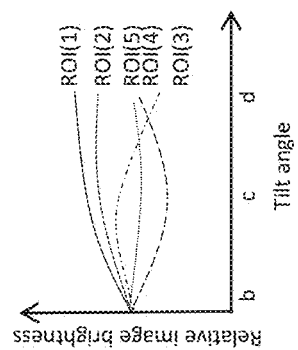
[FIG. 9C]

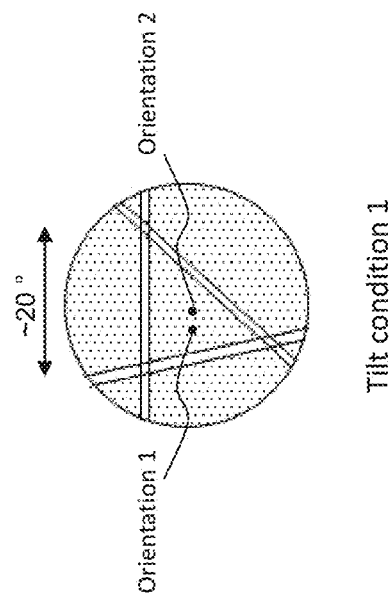
[FIG. 10A]
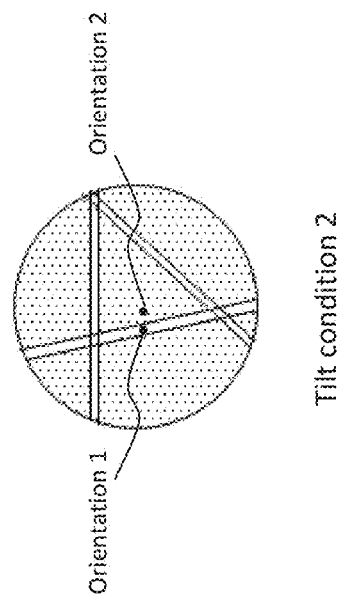
[FIG. 10B]

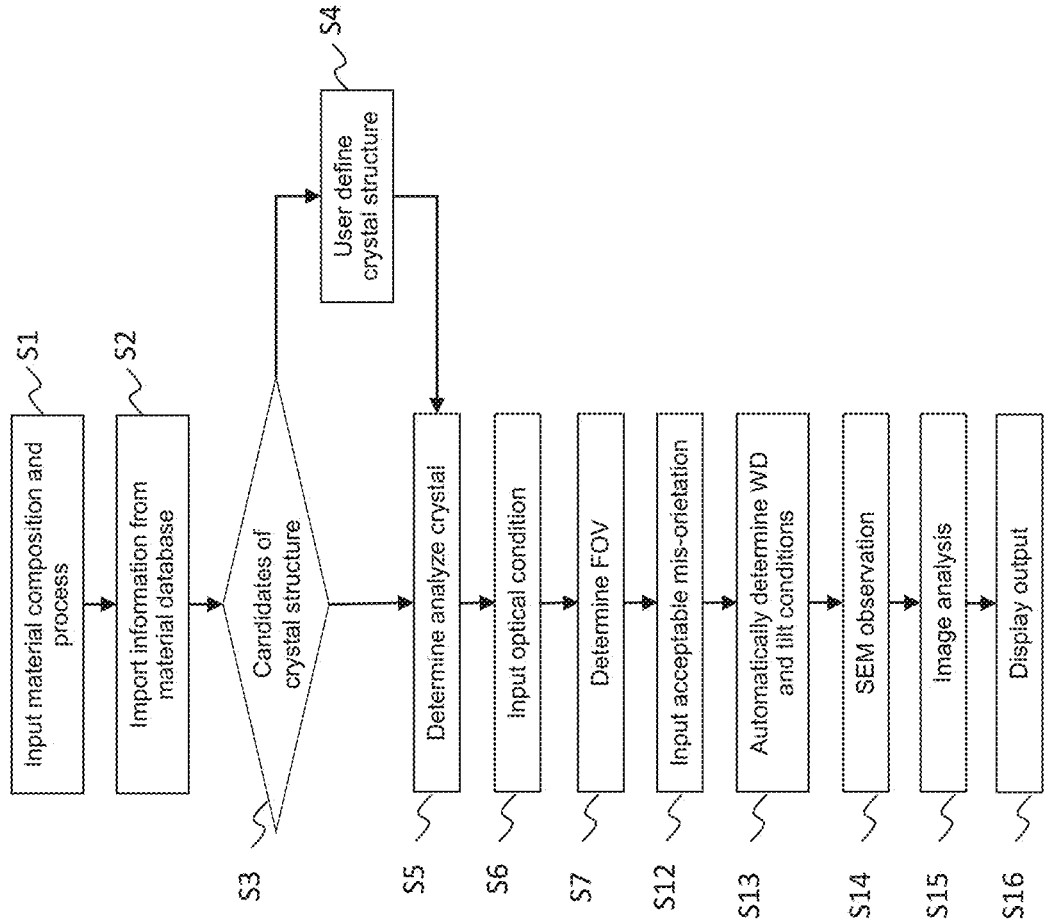
[FIG. 11]

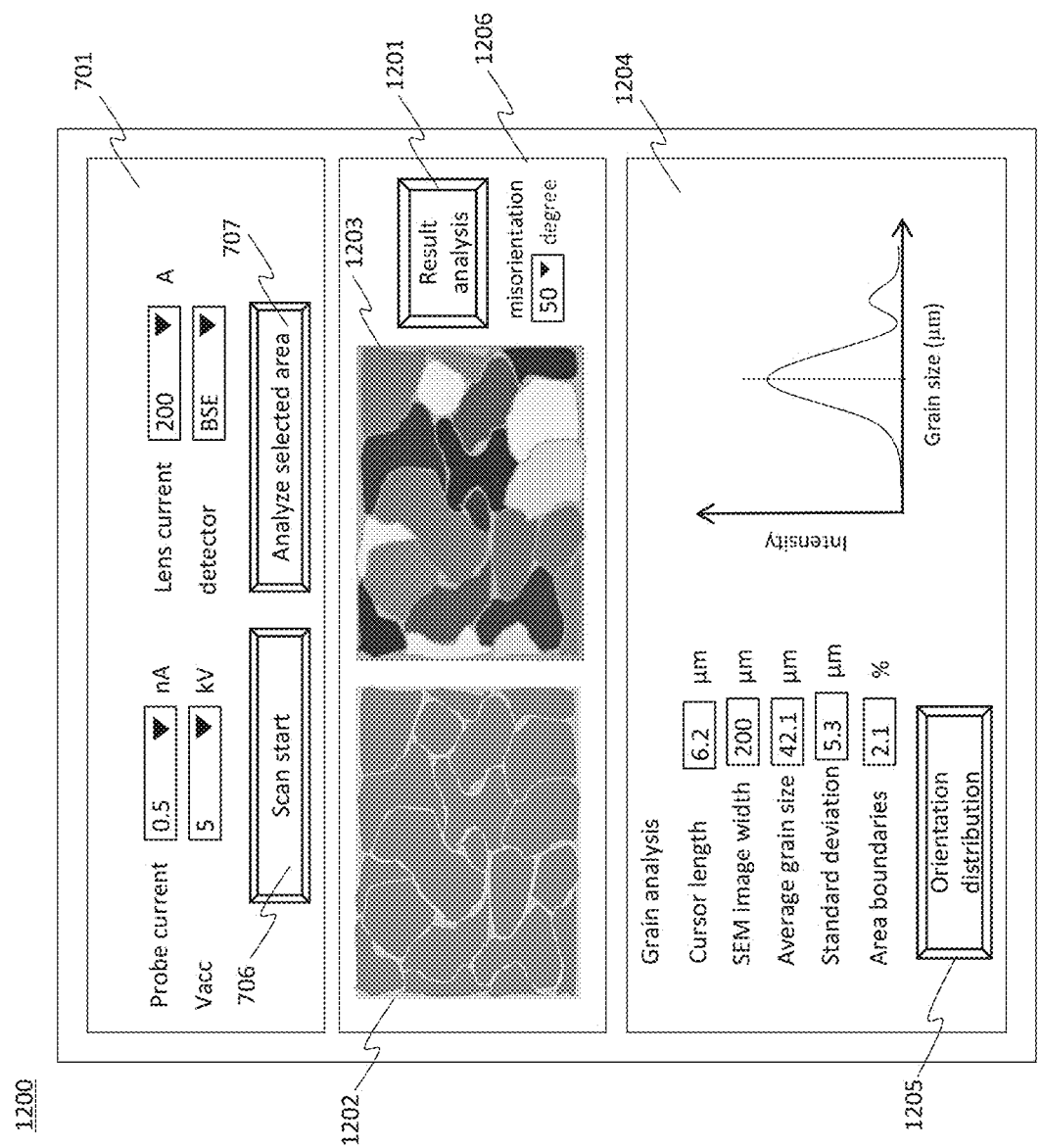
[FIG. 12]

[FIG. 13]
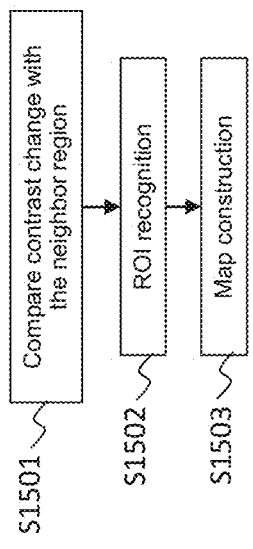

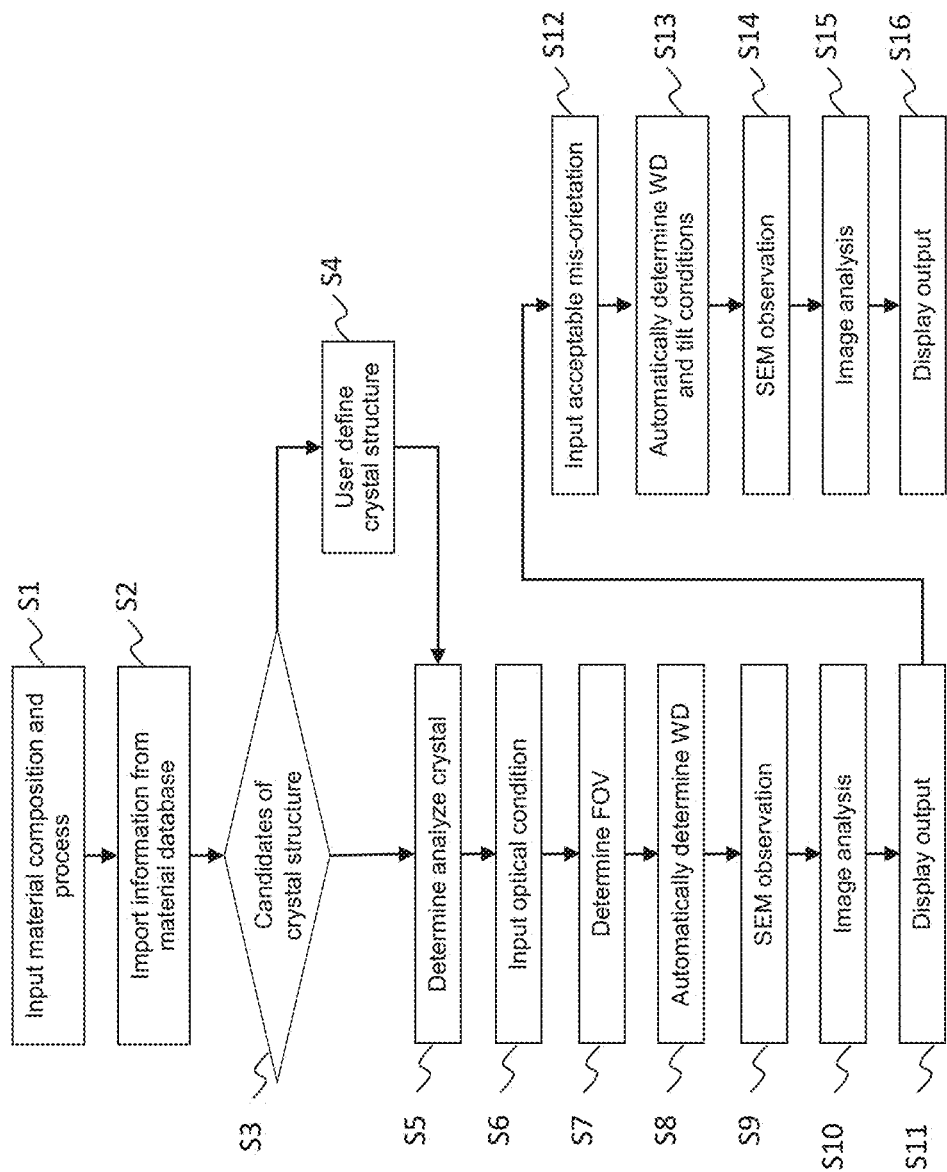
[FIG. 14]

SCANNING ELECTRON MICROSCOPE AND IMAGE PROCESSING APPARATUS

TECHNICAL FIELD

This invention relates to scanning electron microscopes (SEM) and more particularly to a method to identify different crystal phases in samples.

BACKGROUND ART

For material development, crystal information such as crystal phase or crystal orientation is an important characteristic of the material that is related to their physical properties. There has been a number of crystal structure measurement systems proposed that uses electron beam diffraction patterns to identify the crystal information.

For example, JP 2003-121394 discloses an SEM equipped with electron back-scattered diffraction (EBSD) detector which uses electron diffraction pattern, known as Kikuchi pattern, to perform the crystal information analysis. JP 2003-121394 discloses a method to identify crystal phase and orientation with a use of crystal structure database that generates a set of estimated diffraction parameters to identify individual electron backscatter diffraction bands in the image dataset. By matching the observed electron backscatter diffraction bands with estimated diffraction parameters, the crystal information can be obtained. However, EBSD is a surface-sensitive method and it usually takes long time for the measurement depending on the crystal grain size. Also, EBSD cannot evaluate very tiny crystal grain size where mixing of nearby diffraction patterns occurs.

Another method, such as the one disclosed in JP H07-066253, uses SEM with more than one sample tilt or rotation condition. The maximum amount of back-scattered electrons signal among those sample tilt or rotation conditions, which is related to the penetration depth of the primary electrons, is used to determine the direction of crystal plane with respect to the direction of primary electrons. The different amount of back-scattered electron signal originating from different penetration depth of primary electrons provides image contrast which is known as channeling contrast.

CITATION LIST

Patent Literature

[Patent Literature 1] JP 2003-121394
[Patent Literature 2] JP H07-066253

SUMMARY OF INVENTION

Technical Problem

In each cycle of material development, material composition and process conditions that are important parameters for the development are known. Sometimes, the material being developed consists of only a few crystal structures which are responsible for its physical properties. However, crystal analysis of these materials uses the conventional EBSD method which does not allow for fast-screening of the material property. The fast screening process of these materials that provides basic crystal information such as a ratio of crystal phase or average crystal grain size is necessary.

As mentioned above, for crystal analysis, EBSD can visualize crystal phase and orientation with high accuracy. However, it is limited in the size of the crystal that it can analyze and requires a long time to prepare the sample and take measurements. The method that uses channeling contrast is fast and can provide the information of crystal orientation with respect to the direction of primary electrons. However, its application to obtain crystal phase and orientation maps is difficult when there are multiple crystal orientations and phases due to indistinguishable between contrast of different crystal phase and contrast of different crystal orientation. Crystal analysis method that does not require characterization of electron diffraction patterns is important to speed up the material development cycle. This is especially true for materials with known composition and processes and only a few crystal structures are present in the sample.

Solution to Problem

An aspect of the invention is a scanning electron microscope (SEM). This SEM comprising, a sample stage for mounting a sample, a detector for detecting electron emitted from the sample, SEM control section for controlling a distance between the sample stage and the detector, and a memory. The memory stores material database and equation 1. Material database is storing plurality of dataset, each dataset comprising information of a material, information of crystal structure of the material, and information of electron emitted from the material. Equation 1 indicates a relationship between the information of electron emitted from the material, the distance, and a signal detected by the detector.

The other aspect of the invention is an image processing apparatus. This apparatus comprising, an operation interface, a processing section for processing an image data obtained from the operation interface, and a data storage section which storing material database and equation 1. The material database comprising plurality of dataset, each dataset comprising information of a material, information of crystal structure of the material, and information of electron emitted from the material. The equation 1 indicates a relationship between the information of electron emitted from the material, and a signal detected by a detector. And the processing section select one dataset among the material database based on an input data from the operation interface, calculates a brightness information of crystal structure of the material based on selected dataset and the equation 1, section recognizes a region of interest (ROI) in the image data. The processing section determines crystal structure of the ROI based on the image data and the brightness information.

Advantageous Effect of Invention

The invention realizes a system that automatically determines the crystalline phase and orientation of a composition-known sample without extensive sample preparation or sample destruction. Additionally, the system is low cost and has high speed which is useful for the screening process during material development cycles.

BRIEF DESCRIPTION OF DRAWINGS

FIG. 1 is a schematic of a scanning electron microscope (SEM) that uses the method mentioned in the invention.

FIG. 2A illustrates a measurement condition of working distance (WD) according to the first embodiment.

FIG. 2B illustrates SEM images with different working distance (WD) according to the first embodiment.

FIG. 2C illustrates a graph of relative image brightness with different working distances (WD) according to the first embodiment.

FIG. 2D illustrates an intensity and image brightness with different working distance (WD) according to the first embodiment.

FIG. 3 illustrates signal as a function of working distance (WD) for explaining the first embodiment.

FIG. 4 is a flow chart for explaining the first embodiment.

FIG. 5 shows a graphic user interface (GUI) window for a measurement.

FIG. 6 is an example of material database according to the first embodiment.

FIG. 7 is a graphic user interface (GUI) window for a measurement.

FIG. 8A is a flow chart of image analysis according to the first embodiment.

FIG. 8B is a flow chart of image analysis according to the first embodiment.

FIG. 9A illustrates a side view of different measurement conditions.

FIG. 9B illustrates a plane view of SEM images.

FIG. 9C illustrates a graph of relative image brightness with different tilt conditions.

FIG. 10A illustrates general bands of back-scattered electron diffraction pattern for explaining the second embodiment.

FIG. 10B illustrates general bands of back-scattered electron diffraction pattern for explaining the second embodiment.

FIG. 11 is a flow chart for explaining the second embodiment.

FIG. 12 is a graphic user interface (GUI) window for a measurement.

FIG. 13 is a flow chart of image analysis according to the second embodiment.

FIG. 14 is a flow chart for explaining the third embodiment.

DESCRIPTION OF EMBODIMENTS

Hereinafter, an embodiment of this invention is described with reference to the accompanying drawings. It should be noted that this embodiment is merely an example to realize this invention and is not to limit the technical scope of this invention.

In the following embodiments, SEM measurement conditions such as acceleration voltage and information of material composition, process conditions, and candidates of crystal structure either known or imported from material database are used to determine the optimal sample stage tilt angle and working distance (WD). Under these determined tilt angle and WD, crystal phase and orientation of a sample can be analyzed, resulting in fast acquisition of crystal phase and orientation maps.

One embodiment explained below is a scanning electron microscope (SEM) system comprising: a use of materials database containing materials composition, formation process, crystal structure and its electron yield; a sample stage that is able to move, rotate and tilt; a processing section for calculating optimum working distance for an observation from material database and measurement condition; means for acquiring an image of crystal information of a desired area of a sample based on an image obtained from SEM observation.

[First Embodiment]

The first embodiment is explained using FIGS. 1 to 8.

FIG. 1 shows the schematic of a scanning electron microscope (SEM) that employs the method in the present embodiment.

Firstly, configuration of an SEM in FIG. 1 is described. From an electron gun 101 and its generated primary electron beam 102 through the downstream direction composes of scanning coil 103, objective lens 104 and sample stage 108. A sample 107 is put on the sample stage 108 for an observation. An electron gun 101, scanning coil 103, objective lens 104 and sample stage 108 is controlled by SEM control system section 109 which connects to data storage section 110, processing section 111.

An acquisition method of an SEM image or SEM observation for this embodiment will be explained with reference to FIG. 1. An electron gun 101 is used to generate a primary electron beam 102 which is focused onto the sample 107 by objective lens 104. The scanning coil 103 is used to two-dimensionally scan the primary electron beam 102 across the surface of sample 107. The user can choose the scanned region by moving the sample by controlling the sample stage 108. The electron beam 102 that is irradiated onto the surface of the sample 107 interacts with the sample 107. As a result, emitted electrons 112 and 113 such as secondary electrons, back-scattered electrons and Auger electrons are generated from the sample 107. The emitted electrons 112 and 113 that arrive at a detector are detected as signals. In this invention, emitted electrons 112 and emitted electrons 113 can be detected by detector 105 and detector 106. The detectors output voltage or current signals that is proportional to the number of detected electrons to SEM control system section 109 to create an SEM image. The obtained SEM image is stored in a storage section 110, image processed and analyzed by processing section 111 and is displayed at the operation interface 114. Operation interface 114 comprises ordinary input devices such as key board and output devices such as display.

Although it is not shown, there are components other than the control system and the circuit system such as that arranged in vacuum chamber and operation section of vacuum evacuation. In addition, in the present embodiment, the detector 105 is placed between electron gun 101 and scanning coils 103, but the position arrangement could be changed.

From here, the present embodiment describing crystal phase discrimination of a sample that is known to have two different phases, one phase with single orientation and one phase with multi orientation, is explained. We define crystal phase discrimination to mean the ability to distinguish one crystal phase from another.

FIG. 2A illustrates a change in the measurement setup when position of sample 107A and sample stage 108A moves to a new position, sample 107B and sample stage 108B. The distance between objective lens 104 and surface of the sample 107, is defined here as working distance (WD). When the stage 108 moves to new position, the WD is changed simultaneously.

FIG. 2B illustrate the result of SEM images obtained at short WD to long WD with labeling of region of interest (ROI). In this case, the ROI is a domain of grains with the same crystal phase although it can be other things in different situation such as grain boundaries. When WD is changed, image contrast in FIG. 2B (a) to (c) are changed due to different detection range of electron emission angle. The image with longer WD is darker due to decrease in the amount of signal detected at detector 106.

FIG. 2C describes relative brightness for each ROI normalized so the brightest ROI from each of the images FIG. 2B (a)-(c) is 1.

FIG. 2D illustrates histogram of image brightness of two different crystal phases, Phase 1 (multi orientation) and Phase 2 (single orientation), at different WD. Since imaging condition that gives a large contrast between different phases and a small contrast within a phase is desired for crystal phase discrimination, the measurement condition at which crystal phase discrimination of a sample 107 can be easily performed according to FIGS. 2C and 2D is when WD is long. That is, in general long WD is preferable for crystal phase discrimination. However, the amount of signal of emission electrons 113 which results in image brightness is needed to be considered.

The amount of electron that is detected by the detector 106 can be calculated from equation (1) where signal is the amount of emission electron 113 detected at detector 106, Ip is probe current of primary electron 102, yield is the electron yield defined as the average number of electrons the sample 107 emits per incident primary electron 102, $f_1(WD)$ is a function of WD and $f_2(G)$ is a function of detector gain.

$$\text{signal} = Ip \times \text{yield} \times f_1(WD) \times f_2(G) \qquad (1)$$

FIG. 3 illustrates signal as a function of working distance (WD). Here, only the factors that are relevant to this embodiment are shown in equation (1). It is generally known that the amount of emission electron 113 detected at detector 106 is decreasing when increasing WD as described by $f_1(WD)$ 301, in FIG. 3. Increasing WD provides a condition for better crystal phase discrimination but the decreasing of signal worsen the signal-to-noise ratio. Since materials with different phases have different yield, and therefore different signal intensity, every material with different phases has a different optimal WD to obtain the best SEM image for phase discrimination. The optimum WD to perform crystal phase discrimination can be estimated from the condition of Ip and yield that provides the signal greater than the minimum analyzable signal. For example, the minimum analyzable signal is determined as a signal that gives signal-to-noise ratio greater than 3.

FIG. 4 is a flow chart for explaining the first embodiment. This processing is mainly executed by processing section 111 based on the software stored in the memory.

FIG. 5 shows a GUI window for a measurement which is generated by processing section 111. Data or information for generating the GUI are stored in data storage section 110 in advance.

The procedure to perform crystal phase discrimination is explained using a flow chart in FIG. 4 and the corresponding procedure on the GUI displayed on operation interface 114 shown in FIG. 5.

In step S1, the user input material composition and material process such as percentage of elements in the sample 107, formation temperature, formation pressure and quenching condition in the window 501 and window 502 in GUI 500. In general, the user has above basic information about the sample. In step S2, by using operation button 503 on GUI 500, the information such as crystal structure and secondary electron yield will be imported from material database.

FIG. 6 is an example of material database 600. The material database 600 is prior stored at data storage section 110. The material database 600 contains material composition 601, material process 602, crystal structure 603, secondary electron yield 604A and back-scattered electron yield 604B. Material composition 601 includes for example percentage of elements and dopants. Material process 602 includes for example formation temperature, formation pressure and quenching condition. Crystal structure 603 includes for example phase and orient. Electron yields 604 are for example defined for type of detector and applied acceleration voltage. Crystal structure 603 and Electron yields 604 are determined based on the general knowledge about the material. The users can also import a different database containing the same type of information using an operation button 509 on GUI 500.

In step S3, candidates of crystal structure in the sample 107 according to the information input in S1 and information in S2 are suggested using processing section 111 and the result of candidates is shown in window 506 on GUI 500. If there are same conditions inputted by user in the material database 600, the processing section 111 selects the structure corresponding to the condition. If there is not same condition inputted by user in the material database 600, the processing section 111 suggests structure corresponding to the most similar condition. In this embodiment, the candidates are body center cubic (BCC) and face cubic center (FCC).

If the result of candidates is not preferred by the user, step S4 is performed. In step S4, the user can define the crystal structure using operation button 504. The defined structure will be listed in window 506. In window 505, the user can see the basic crystal information of each crystal structure listed in window 506. In this example, BCC is selected in window 506 and the basic crystal information of BCC appears in window 505 on GUI 500.

In step S5, the user uses the information in window 505 to finalize the crystal structures to be analyzed which is shown as a list in window 507. In this example, BCC and FCC are assumed to be present in the sample and, therefore, selected. After deciding the crystal structures to be analyzed, clicking the operation button 508 will lead to the next step GUI for analysis.

FIG. 7 shows a GUI window 700 for analysis. Here, the processing section 111 suggests the measurement condition for the analysis according to electron yield in material database 600 and shows on window 701 of GUI 700 at first. In addition, the processing section 111 also estimates the relative image brightness of each crystal phase according to material database 600 in order to use for image analyzing in step S10.

The suggested measurement conditions which are shown when window 701 is popped-up are considered from most frequently used conditions to analyze SEM images for the subject materials which is generally known. For example, for a sample with SEY<1, the suggested probe current Ip is 10 nA for crystal analysis; for a sample with SEY>1, the suggested probe current Ip is 1 nA for crystal analysis. Other conditions such as acceleration voltage, type of detector are suggested in same way. These conditions should be prior installed in the data storage section 110. The default condition of lens current, which is related to focusing condition, is 'auto'. Under the 'auto' setting, the SEM control section 109 will calculate the lens current to focus primary electron beam onto the sample. The user also can input conditions in window 701 by themselves.

In step S6, the user determines measurement condition for SEM observation such as acceleration voltage of primary electron ($V_{acc}$), type of detector, lens current and probe current using window 701 then uses operation button 706 to scan SEM image. The scanned SEM image shows in window 702. At this stage applied WD can be predetermined as a fixed value (for example medium length).

In step S7, the user determines field of view (FOV) for the analysis by observing window 702 and moving sample stage 108. When the FOV is determined, the analysis to determine the crystal phase of selected area starts by using operation button 707. Estimated WD is not applied at this step 7 because it is not necessary as long as SEM image can be scanned in order to determine FOV. If predetermined WD is needed, it shall be fixed with a value of a distance between sample surface and objective lens such as 15 mm, when detector 106 is inserted or 5 mm when detector 106 is not inserted.

In step S8, the processing section 111 calculate the optimum WD from equation (1) for the analysis and SEM system control section 109 control the position of sample stage 108 according to the optimum WD. The optimum WD which provides the signal greater than the minimum analyzable signal such as a signal with signal-to-noise ratio greater than 3, is calculated by using minimum yield among crystal phases that are being analyzed. For the calculation, Ip is obtained from user settings according to window 701. Yield is obtained by material database 600. $f2(G)$ depends on the detector itself so it is prior installed in the data storage section 110.

The yield that will be used for calculation depends on type of detector and acceleration voltage ($V_{acc}$) listed in window 701. In the case of FIG. 7, we explained using BSE detector and $V_{acc}$=5 kV, so the BSEY with 5 kV will be applied (see FIG. 6). When the sample contains more than 1 phase i.e. BCC and FCC, step S8 will compare yields of BCC and FCC and then choose the minimum yield.

SEM observation is performed in step S9 with calculated WD. The obtained SEM image 702 is processed and analyzed in step S10.

FIG. 8A is a detailed flow chart of image analysis step S10. Here, in step S1001, ROI recognition is performed such as by detecting edge in the image and defining the area enclosed by an edge line as an ROI. In step S1002A, brightness measurement of the average brightness of the pixels constituting each ROI in SEM image is performed. Then, brightness between each ROI in SEM image and image brightness of each crystal phase estimated using equation (1) by processing section 111 according to material database 600 is compared. When the image brightness of evaluated area and the estimated image brightness of crystal phase i.e. Phase 1, are same within an ignorable range such as within 5% difference, the evaluated area is analyzed as Phase 1. In step S1003A, crystal phase map, defined as a map showing different colors or styles according to different crystal phase, is constructed. In step S11, the result of SEM image and crystal phase map is displayed in window 702 and 703 at the operation interface 114.

As explained above, the image brightness is estimated based on the value of signal calculated by equation (1) since the brightness is in proportion to the signal. For calculating signal of each phase, Ip, ff1, and $f2$ in equation (1) are fixed based on the optical condition determined in window 701 by step S6. Yield for calculating brightness of each phase are selected from the data of material database 601 based on the crystal structures determined in step S5.

For example, when the user determined analyze crystal based on input data "Fe 100%, T=950, P=2*10$^5$, $R_{quenc}$=30, Additive=Al" in window 501 and 502, the material on second line of FIG. 6 will be the crystal structures to be analyzed. Also supposed that the user chose the type of detector as BSE and $V_{acc}$=5 kV in window 701. The material includes BCC and FCC phases as shown in FIG. 6, assigning 0.28 as yield for brightness of BCC phase and assigning 0.29 as yield for brightness of FCC phase (when using BSEY 5 kV as optical condition). When the value of image brightness is normalized, the brightest image is defined as 1. In step S1002A the processing section 111 can identify the phase of each ROI included in the sample image based on the estimated image brightness of a crystal phase.

In the example explained by FIG. 4, sample image is acquired from SEM measurement. In another example, the sample images may be stored in the data storage section 110 or an external storage device such as magnetic disk apparatus beforehand. Such external storage device can be connected via network. In this instance, the processing section 111 and the data storage section 110 which stored material data base 600 can be applied as an image processing apparatus which can be connected to the storage device or SEM.

FIG. 8B is a detailed flow chart of another example of image analysis step S10. For the present embodiment with analysis of a sample with only two crystal phase, the obtained SEM image 702 can also be processed and analyzed in step S10 with the details shown in the flow chart shown in FIG. 8B. Step S1001 is performed as described above.

In step S1002B, image brightness of the obtained SEM image 702 is measured resulting in the histogram of pixel brightness in window 704. In order to perform binary image method, brightness measurement of the average brightness of the pixels constituting each ROI in SEM image is performed. Image processing with binary image method is applied to a set of average brightness of the pixels constituting each ROI in SEM image by using binary threshold as average of image brightness of each crystal phase estimated using equation (1) by processing section 111 according to material database 600. The binary threshold is not limited to the method described here.

In step S1003B, crystal phase map is constructed. Using an operation button 708, information of crystal phase map such as average domain size and area of each crystal phase in SEM image 703 is analyzed and displayed in window 704. According to user's knowledge, the user can also adjust the binary threshold level that is the intensity level at which binary segregation is performed, manually using window 704 and re-analyzed the information in window 704 by using operation button 709.

With the embodiment described, fast crystal phase discrimination was performed. In this embodiment, detection of different electron emission angle was performed but it is not limited to detector 106 and emission electron 113. The detector 106 and emission electron 113 might be replaced by any emission electron detection system. In addition, the present embodiment mentioned changing WD by moving samples stage 108, but it is not limited. Changing WD also includes moving of detector 106 and others.

[Second Embodiment]

The present embodiment describing crystal orientation discrimination for extracting an average grain size of a sample that is known to have single crystal phase with multiple crystal orientations is explained. We define crystal orientation discrimination to mean the ability to distinguish one crystal orientation from another with the same phase. The second embodiment is described referring to FIGS. 9 to 12. SEM and method to acquire SEM image referring to FIG. 1 in the present embodiment are the same as described in the first embodiment.

In contrast to the first embodiment, a crystal orientation dependent contrast within a phase is desired for crystal orientation discrimination. Since shorter WD generates a large contrast within a phase as a result of channeling contrast, according to measurement condition such as type of materials, electron yield and probe current the WD is prior determined. Since the signal is known to decrease when WD becomes too short as shown in $f_1$(WD) 301, the shortest WD that gives signal greater than the minimum analyzable signal is calculated by using equation (1). For example, the minimum analyzable signal is determined as a signal that gives signal-to-noise ratio greater than 3.

FIG. 9A illustrates a measurement when position of sample 107C and sample stage 108C moves to a new position, sample 107D and sample stage 108D. The angle between sample stage 108D and horizontal plane is defined here as tilt angle.

FIG. 9B illustrates the result of SEM images obtained by detector 106 at different tilt angles with labeling of ROI. In this case, the ROI is a domain of a crystal orientation. When the tilt condition is varied, image contrast in FIG. 9B (a) to (c) changes accordingly because the amount of emission electrons 113 detected by detector 106 changes. The intensity for each ROI changes differently due to different angle between primary electron beam and crystal orientation. When primary electron beam and lattice plane are parallel, SEM image shows dark image brightness since most primary electron can deeply penetrate into the lattice. On the other hand, when primary electron beam and lattice plane are not parallel, SEM image shows bright image brightness due to large scattering of primary electron with the crystal.

FIG. 9C shows relative image brightness for each ROI normalized to that of when tilt angle is zero according to FIG. 9B (a) through (c).

The amount of electron that is detected by the detector 106 depends on angle between primary electron beam and sample tilt angle. A change of relative image brightness of the ROIs shown in FIG. 9C is due to the difference in the penetration depth leading to different amount of signal electron emission.

FIGS. 10A and 10B illustrates electron channeling patterns (ECP). FIG. 10A shows a typical ECP at tilt condition 1. When the stage is tilted by 10 degree to tilt condition 2, the ECP is shifted as shown in FIG. 10B. The position in ECP is related to crystal orientation observed in SEM image such as orientation 1 and 2 labeled in FIG. 10A. In this case, orientation 1 and orientation 2 are both dark in the SEM image. With tilt condition 2, orientation 1 and 2 labeled in FIG. 10B show bright and dark in the SEM image, respectively. Orientations that are inside and outside the diffraction band, for example, results in the orientations shown as bright and dark regions in the SEM image, respectively, due to different amount of emission electron. Generally, the range of tilt angles for observing most of crystal orientation is about 20 degree i.e. ±10 degree. This is because principle bands in the ECP present in the range of 20 degree, thus shifting the ECP in this range will give a change in SEM brightness for most of orientations.

With the WD that is prior determined, a range of possible tilt angle might be less than 20 degree considered from the geometry of SEM at which none of crashing between physical bodies occurs during tilting. In this case, new WD that 20 degree range of possible tilt angle is satisfied is calculated and used for crystal orientation discrimination. Tilt condition is determined by range of possible tilt angle and acceptable angle of mis-orientation which is an angle between two different orientations to be analyzed as same orientation as shown in equation (2) where θ(n) tilt angle for a tilt condition is $n^{th}$, $\theta_{range}$ is a range of possible tilt angle and δ is acceptable angle of mis-orientation. The measurement of SEM images is performed for n conditions of at least one tilt and/or rotation axis according to the calculated tilt angle.

$$\theta(n) = n \times \frac{\theta_{range}}{\delta} \quad (2)$$

FIG. 11 is a flow chart of process for crystal orientation discrimination for extracting an average grain size of a sample that is known to have single crystal phase with multi-orientations. Step S1 through step S5 are same as described in the first embodiment. Since single crystal phase is considered in the present embodiment, in step S5, the user finalizes one crystal structure to be analyzed which is shown as a list in window 507. For crystal orientation discrimination for extracting an average grain size of a sample, clicking the operation button 511 will lead to the next step with GUI 1200 shown in FIG. 12.

In step S12, after determine FOV in step S7, user inputs acceptable mis-orientation in window 1206 on GUI 1200 and click an operation button 707. In step S13, the processing section 111 calculates the minimum WD according to equation (1) that yields SN greater than 3. Then, the processing section 111 calculate tilt conditions according to equation (2) and re-calculate or determine WD that satisfied the tilt conditions by considering the geometry such as sample size, sample height and position of physical bodies in SEM. The analysis and SEM system control section 109 controls the position of sample stage 108 according to the calculated WD and tilt conditions. In step 14, SEM observation is performed for all tilt conditions determined in step S13. Since the crystal orientation can exist in a sample with 3-dimensional rotation, SEM images of at least 3 tilt conditions such as 3 tilt conditions of zero tilt angle and a tilt angle at two different tilt axis, are observed.

After click an operation button 1201, the obtained SEM images are processed and analyzed in step S15 with the details showing FIG. 13. To determine ROI, edge detection of SEM images taken at each of the tilt conditions is performed in step S1501. In step S1502, edge detected SEM images are overlaid to form an SEM image with all of the detected edges. Area enclosed by the edge line is the ROI. In step S1503, grain map, defined as a map showing different colors or styles according to different ROI, is constructed. In step 16, the result of SEM image and grain map is displayed in window 1202 and 1203 at the operation interface 114. The user can analyze average grain size by using window 1204 on GUI 1200.

[Third Embodiment]

The present embodiment describes crystal analysis of a sample that only its composition and material process are known. The third embodiment is described referring to FIG. 14. A scanning electron microscope (SEM) and method to acquire SEM image referring to FIG. 1 in the present embodiment are the same as described in the first embodiment.

The crystal analysis in the present embodiment contains both crystal phase discrimination and crystal orientation discrimination for extracting an average grain size of a sample. For crystal analysis of a sample that only its composition and material process are known, material database 600 which is used in step S2 is important to match crystal candidates and information input in step S1. The finalized crystal structure to be analyzed which is shown as a list in window 507 may contains only one or more than one crystal phases. If there is only one crystal structure to be analyzed, the process will follow the steps in FIG. 11 same as described in the second embodiment. If there is more than one crystal structure to be analyzed, crystal phase discrimination is performed prior to crystal orientation discrimination for extracting an average grain size.

FIG. 14 is a flow chart of process for crystal analysis of a sample with more than one crystal structure to be analyzed. Step S1 through step S11 are same as described in the first embodiment. After the step S11 finished and the result of SEM image and crystal phase map is displayed in window 702 and 703 at the operation interface 114, the user uses an operation button 705 on GUI 700 in order to perform further crystal orientation discrimination for extracting an average grain size. Then, Step S12 through step S15 are performed same as described in the second embodiment.

[Fourth Embodiment]

The present embodiment describes a method for extracting distribution of orientations that exists in a sample. With a sample that is known to have single crystal phase with multi-orientations, a fast screening of how a sample is oriented can be performed. A scanning electron microscope (SEM) and method to acquire SEM image referring to FIG. 1 in the present embodiment are the same as described in the first embodiment.

The processes of crystal orientation discrimination will be the same as described in the second embodiment. Here, the ROI is defined as a grain domain according to the result of analysis described in the second embodiment. The distribution of orientations that exists in a sample can be extracted by using an operation button 1205. After using operation button 1205, brightness measurement of the average brightness of each ROIs at all tilt conditions is performed by analyzing section 111. The dependence of the average brightness of each ROIs on tilt conditions such as that shown in FIG. 9E is used for assigning same or different orientation for each ROIs. When the image brightness of ROI(1) and ROI(2) are same within an ignorable range such as within 5% difference for all tilt conditions, the ROI(1) and ROI(2) is analyzed as the same orientation. Then, the result of distribution of orientations such as number orientations that exists in a sample and an orientation map grain map, defined as a map showing different colors or styles according to different orientation analyzed in the present embodiment, appear at the interface 114.

BRIEF DESCRIPTION OF SYMBOLS 101 electron gun
102 primary electron
103 scanning coil
104 objective
105 detector
106 detector
107, 107A, 107B sample
108, 108A, 108B sample stage
109 SEM system control section
110 data storage section
111 processing section
112 emitted electron
113 emitted electron
114 operation interface
500 GUI window
501 window
502 window
503 operation button
504 operation button
505 window
506 window
507 window
508 operation button
509 operation button
511 operation button
600 database
700 window
701 window
702 window
703 window
704 window
705 operation button
706 operation button
707 operation button
708 operation button
709 operation button
1200 window
1201 operation button
1202 window
1203 window
1204 window
1205 operation button
1206 window

The invention claimed is:

1. A scanning electron microscope (SEM) comprising:
a sample stage for mounting a sample;
a detector for detecting an electron emitted from the sample;
an SEM control section for controlling a distance between the sample stage and the detector;
a memory, which stores:
a material database storing a plurality of datasets comprising information associated with a material, information of a crystal structure of the material, and information of an electron emitted from the material; and
a first relationship between the information of electron emitted from the material, the distance, and a signal detected by the detector.

2. The system of claim 1, wherein the SEM control section calculates the distance between the sample stage and the detector based on the first relationship and the material database.

3. The system of claim 2, wherein the SEM control section calculates the distance having maximum length that provides the signal greater than a predetermined threshold value.

4. The system of claim 2, wherein the information associated with the material includes at least material composition information and formation process information, and, the crystal structure information includes phase information.

5. The system of claim 4, wherein the information of the crystal structure includes phase information and orientation information.

6. The system of claim 5, wherein the information of the electron emitted from the material is an electron yield which is defined as a number of electrons emitted from the material per incident electron.

7. The system of claim 6, wherein the first relationship includes a condition parameter of the SEM comprising at least one of probe current of the SEM measurement and gain of the detector.

8. The system of claim 1, further comprising:
a user terminal to receive input specifying a desired resolution for crystal orientation discrimination, wherein the SEM control section controls an angle between the sample stage and the detector, wherein the SEM control section comprises means to continuously aquire SEM images, and wherein the memory contains a second relationship which defines a relationship between the resolution and the angle, to calculate the angles at which the measurements are made.

9. The system of claim 8, wherein the SEM control section comprises means for image processing with overlaying of more than one image; and for determining a region of interest (ROI).

10. The system of claim 8, wherein the SEM control section comprises means for optimizing the distance between the sample stage and the detector using the first relationship, the materials database, and the angle between the sample stage and the detector.

11. The system of claim 8, wherein the acquiring means is configured to perform at least one of tilting and rotating a stage for more than three conditions of tilt.

12. An image processing apparatus comprising: an operation interface; a processing section for processing image data obtained from the operation interface; and a data storage section which stores a material database and a plurality of signal values according to the a first relationship wherein the material database comprises a plurality of datasets, each said dataset comprising information associated with a material, information of a crystal structure of the material, and information of an electron emitted from the material, the first relationship indicates a relationship between the information of electron emitted from the material, and a signal detected by a detector, the processing section selects one dataset among the material database based on input data received from the operation interface, the processing section calculates brightness information of the crystal structure of the material based on the selected dataset and the first relationship, the processing section recognizes a region of interest (ROI) in the image data, and the processing section determines the crystal structure of the ROI based on the image data and the brightness information.

13. The apparatus of claim 12, wherein the information of the crystal structure includes at least two phases, and the information of the electron emitted from the material includes an electron yield of each phase.

14. The apparatus of claim 12,
    wherein the information associated with the material includes at least one of material composition information and formation process information, and
    wherein the processing section is configured to accept the input data including at least one of a known material composition information and a known formation process information.

15. The apparatus of claim 12, wherein the operation interface displays the image data and a crystal phase map with colored or filling patterned for each ROI based on the determined crystal structure.

* * * * *